United States Patent [19]

Schalamon et al.

[11] Patent Number: 5,781,563
[45] Date of Patent: Jul. 14, 1998

[54] SUBSTITUTE CIRCUIT FOR A PLURALITY OF FUNCTIONAL UNITS

[75] Inventors: Friedrich Schalamon, Germering; Kunihiko Iki, Fürstenfeldbruck, both of Germany

[73] Assignee: Siemens Aktiengesellschaft, Munich, Germany

[21] Appl. No.: 793,654

[22] PCT Filed: Aug. 4, 1995

[86] PCT No.: PCT/DE95/01024

§ 371 Date: Feb. 27, 1997

§ 102(e) Date: Feb. 27, 1997

[87] PCT Pub. No.: WO96/07138

PCT Pub. Date: Mar. 7, 1996

[30] Foreign Application Priority Data

Aug. 31, 1994 [DE] Germany ............. 44 31 021.8

[51] Int. Cl.[6] .............. G01R 31/08; G06F 11/00; G08C 15/00; H04L 1/00
[52] U.S. Cl. .............. 371/30; 364/470.12; 364/733; 364/149
[58] Field of Search .............. 371/30; 200/50.39, 200/50.37, 50.4, 51; 315/200, 219; 395/185.1; 364/229.41, 470.12, 733, 149

[56] References Cited

U.S. PATENT DOCUMENTS

| | | | |
|---|---|---|---|
| 4,448,074 | 5/1984 | Schmidt | 73/585 |
| 4,558,216 | 12/1985 | Rodi et al. | 250/223 |
| 4,623,974 | 11/1986 | Dentz et al. | 364/551 |
| 4,774,451 | 9/1988 | Mehnert et al. | 323/263 |
| 4,947,386 | 8/1990 | Preschutti | 370/26 |
| 4,970,722 | 11/1990 | Preschutti | 370/94.3 |
| 4,972,292 | 11/1990 | Petersen | 361/56 |
| 5,066,930 | 11/1991 | Morse | 333/164 |
| 5,229,999 | 7/1993 | Cushing et al. | 371/3 |

*Primary Examiner*—Reba I. Elmore
*Assistant Examiner*—McDievnel Marc
*Attorney, Agent, or Firm*—Hill & Simpson

[57] ABSTRACT

For a defective functional unit (FE1), it is possible to switch over via electronic input and output changeover switches (EUS1, AUS1) via a combination unit (KOM) to a substitute functional unit (EFE). The input signal (ES1) is supplied via a combiner (VK1) to the substitute functional unit (EFE) and is supplied via a splitter (VK2) to the output changeover switches (AUS1, ...), and is connected through only by the output changeover switch (AUS1) of the defective functional unit (FE1).

12 Claims, 6 Drawing Sheets

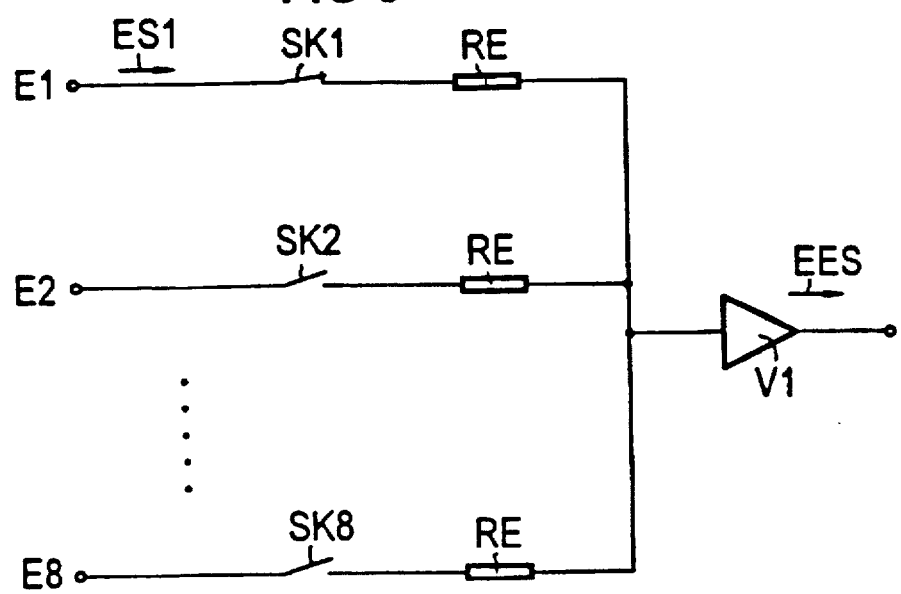
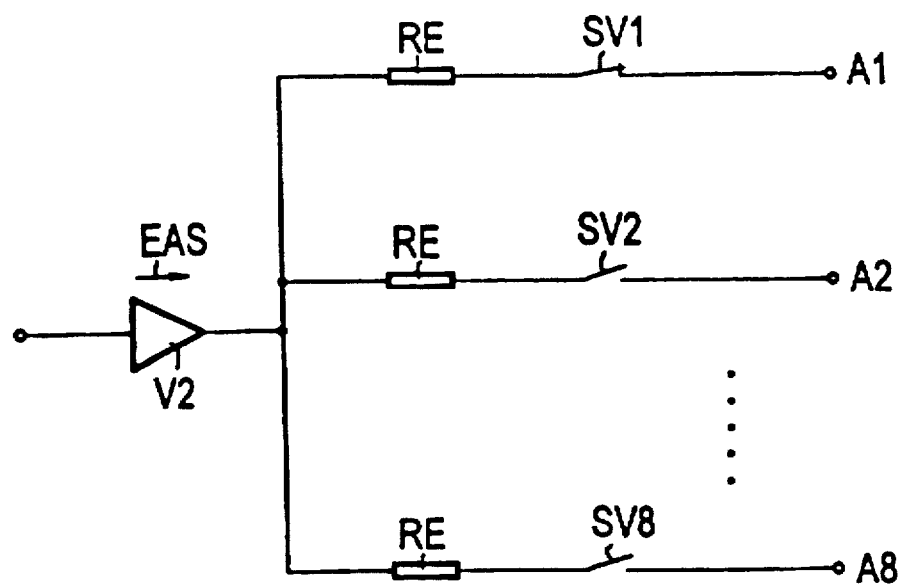

SUBSTITUTE CIRCUIT FOR A PLURALITY OF FUNCTIONAL UNITS

BACKGROUND OF THE INVENTION

The invention relates to a substitute circuit for a plurality of functional units.

A substitute circuit which is connected via mechanical switches is presented in the Patent Abstract of Patent JP-A-59 011 454.

It is known for substitute circuits to be provided in order to improve the operational reliability. If a functional unit, for example an assembly, fails, this functional unit is isolated from the signal path (or the signal paths), and a substitute functional unit is connected in its stead. Relays have been used for changing over; in the case of digital signals, an implementation of the switching over is also possible by means of logic modules.

Laid-Open Specification of German reference DE 41 32 598 A1 discloses a system for switching over telecommunications devices, in which a changeover to a substitute device is made for the purpose of substitution or for testing one of these devices. Relays are used for switching over.

The use of relays for switching over operational functional units and substitute functional units is extremely problematic. The reliability of the relays decreases rapidly for the changeover operations, which are carried out extremely rarely.

In the case of a substitute circuit which processes digital or analog signals at relatively high frequencies of about 30 Megahertz (MHz) or even several Gigahertz, further problems arise.

The relay contacts have excessive capacitances, so that their use is not feasible for this reason alone. In addition, this solution would necessitate the provision of greater power.

The generally used ECL (emitter couple logic) technology requires considerable power levels, so that logic circuits are not ideal for changing over, just for reasons of power consumption. In addition, there are also no modules with which implementation would be feasible for higher frequencies.

Diode switches which are more suitable for changeover purposes in the radio-frequency range are known from the German Examined Specification 26 08 117.

The Laid-Open Specification of German reference DE 41 02 930 A1 discloses a circuit for splitting or combining radio-frequency power, in which the initial outlet impedance, which acts between the individual pores in each case, is formed by an absorber resistor, which is connected to ground at one end, for splitting radio-frequency power, which is supplied from a sum port, to a plurality of individual ports and for combining radio-frequency power, which is supplied from individual ports, in a sum port. However, only a low level of decoupling is provided between the inputs and the outputs in this arrangement.

Combiners for VHF and UHF signals are described in the journal "MICROWAVES and RF", December 1990, pages 100 to 108 and October 1993, pages 81 to 86 and 132. There is no reference quoted for use with digital signals or for substitute circuits.

SUMMARY OF THE INVENTION

The object of the invention is to specify a substitute circuit, which is suitable for higher frequencies, for a plurality of functional units.

The use of in each case only one substitute functional unit for a plurality of operational functional units is particularly advantageous. Duplication of systems or functional units is generally no longer necessary for a high level of fail-safety.

The use of double distributors/combiners which are constructed using transformers has been found to be particularly expedient. The double distributors/combiners are used for distributing a signal from an input between two outputs or for combining two signals onto this output. These passive components require no operating power whatsoever and have inputs and outputs which are decoupled excellently.

Combiners and distributors can be designed using pin-diodes, as a particularly simple, cost-effective and advantageous variant.

A plurality of substitute functional units can also be provided for further increased reliability, and are each connected to the associated substitute functional units via a separate combination circuit.

Pin-diode combinations are provided as electronic changeover switches. The attenuation of the switches becomes optimal by pin-diodes which are connected to ground.

It is expedient to accommodate the pin-diode changeover switches on the assemblies of the functional units.

Each functional unit (assembly) expediently contains a so-called rack-mounted computer for monitoring, control and signaling. Its data and the data of other functional units are supplied to a logic circuit, which is expediently located on the combination assembly, disconnects the defective functional units in the event of a fault, and inserts the substitute functional unit.

The use of a plurality of substitute functional units is, of course, also possible in order further to increase the reliability.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIG. 6 shows an outline circuit diagram of a combiner.

FIG. 7 shows an outline circuit diagram of a distributor.

DESCRIPTION OF THE PREFERRED EMBODIMENTS

Figure 1:
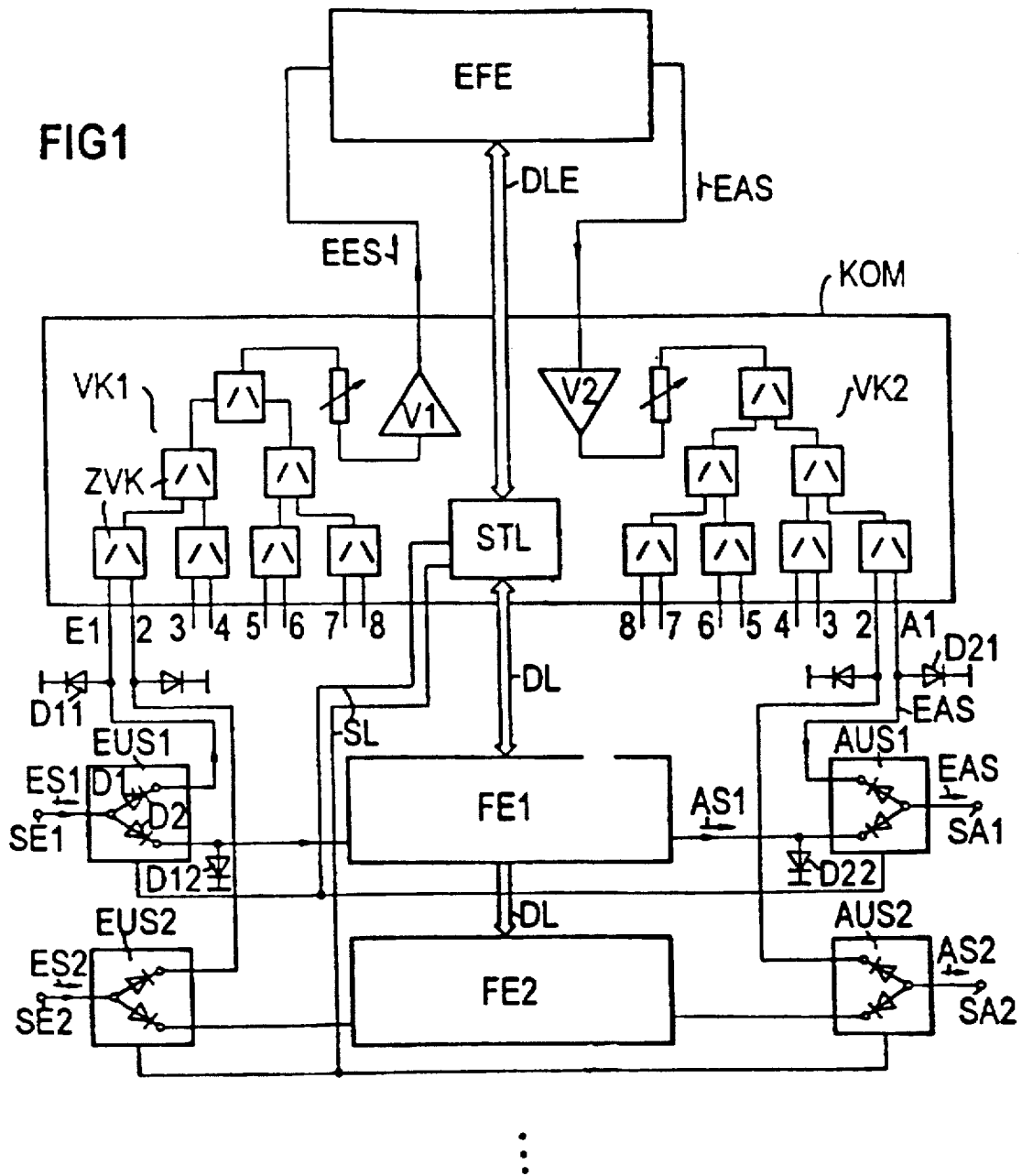
FIG. 1 shows a block diagram of the invention.

FIG. 1 shows the principle of the substitute circuit according to the invention. One substitute functional unit EFE is assigned to a plurality of identical functional units FE1, FE2, .... The outline circuit diagram assumes that there is in each case only one digital input signal ES1, ES2 ... and one output signal AS1, AS2 ... per functional unit. Each functional unit is supplied with its input signal ES1, ES2, .... via a signal input SE1, SE2, ... of an input changeover switch EUS1, EUS2, ...., while the output signal AS1, AS2, ... is emitted via an output changeover switch AUS1, AUS2, ... at a signal output SA1, SA2, ... If a plurality of input signals are supplied to one functional unit and/or if a plurality of output signals are emitted, then these signals are supplied via further changeover switches.

The second output of each input changeover switch EUS1, EUS2, ... is in each case routed to an input E1, E2, ... of a combination unit KOM. Outputs A1, A2, ... of the combination unit are routed in a corresponding manner to second inputs of the output changeover switches AUS1, AUS2, ... The functional units are connected via data lines DL—in this case a bus system—to a control logic device STL which is arranged on the combination unit KOM.

A passive combiner VK1, which is constructed from double 10 distributors/combiners ZVK, is illustrated on the combination unit KOM. In each case one of eight possible input signals is connected through to a first amplifier V1 which passes on this signal, amplified to the original input level and as a substitute input signal EES, to a substitute functional unit EFE. The substitute output signal EAS is split via a second amplifier V2 and a passive combiner VK2 between (in this case) eight outputs, and is supplied in each case to a second input of an output changeover switch AUS1, AUS2, ... The substitute functional unit EFE is also connected via further data lines DLE to the logic circuit LS. The operation of the substitute functional unit can also be monitored via these data lines.

The electronic changeover switches are configured as pin-diode changeover switches and have two diodes D1 and D2, which are interconnected by their same connections.

In the case of the input changeover switches, a further diode D11 or D12 is in each case provided at least at one of their outputs, which diode is forward biased in order to increase the attenuation when the second switch output is not active. The same changeover switches are used for the output changeover switches.

If, for example, the monitoring of the first functional unit FE1 detects a defect, then this is reported to the control logic device STL via the data lines DL. The control logic device STL connects the first input signal ES1 through via control lines LS to the second output of the first input changeover switch EUS1, and thus to the first input E1 of the combination unit KOM. No signal is present at any of the other inputs E2 to E8 of the first distributor/combiner VK1. The input signal ES1 passes to the amplifier V1, is amplified there to the original level, and is supplied as a substitute input signal EES to the substitute functional unit EFE. The latter produces a corresponding substitute output signal EAS, whose level is initially increased by the second amplifier V2, and then emits this at the normal level to all the outputs A1 to A8 of the second distributor/combiner VK2.

Only the first output changeover switch AUS1 connects the substitute output signal EAS through to its signal output SA1, however.

Figure 2:
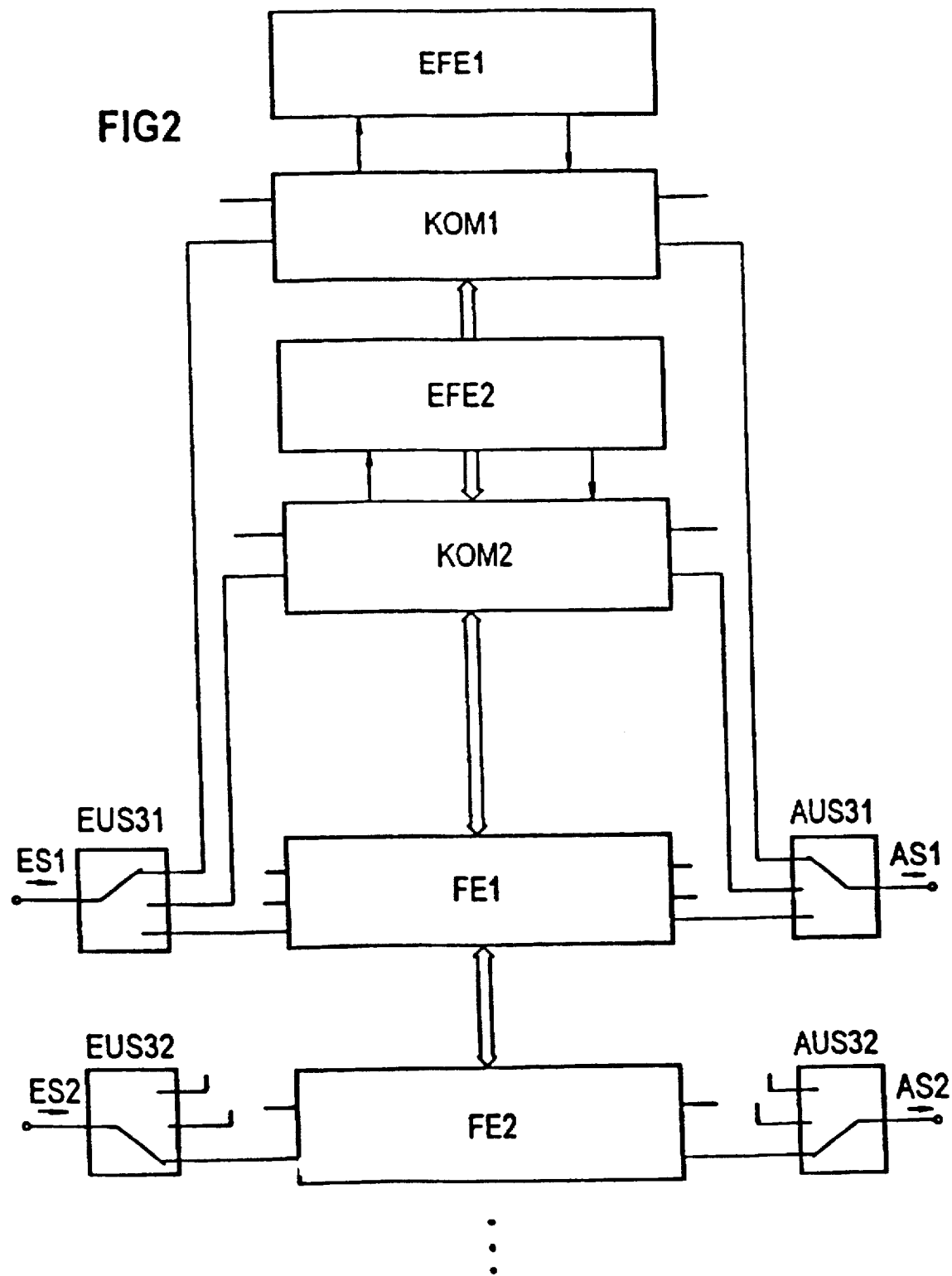
FIG. 2 shows a substitute circuit having a plurality of substitute functional units.

The logic circuit also signals which functional unit has failed. The defective functional unit FE1 can be removed and can be replaced by an intact functional unit. FIG. 2 shows a block diagram having two combination units KOM1 and KOM2, as well as two substitute functional units EFE1 and EFE2. Input changeover switches EUS31 and EUS32 are used, each having three outputs, one of which in each case is connected to the functional unit FE1 or FE2, respectively, and the others are connected to in each case one combination device KOM1 or KOM2. Correspondingly designed output changeover switches AUS31, AUS32, ... each having three outputs are also provided in a corresponding manner. A substitute functional unit can now be selected instead of any desired functional unit via data lines which are not illustrated. This circuit arrangement allows operation to be maintained when a total of two functional units FE or substitute functional units EFE fail.

More than two substitute functional units can, of course, also be provided or—depending on the reliability—mixed forms can be implemented.

Figure 3:
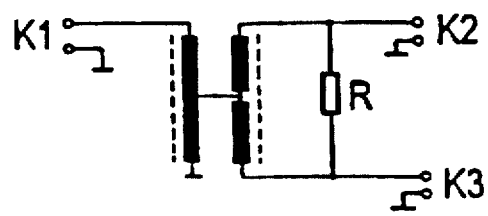
FIG. 3 shows an exemplary embodiment of a distributor/combiner.

FIG. 3 illustrates the principle of a double distributor/combiner. This comprises a first winding W1 having a tap which is connected to a center tap of a second winding W2. A signal which is applied to the connection point K1 is distributed uniformly between the connection points K2 and K3. Two signals which are applied to the connection points K2 and K3 can likewise be emitted, combined, at the connection point K1. The attenuation between the connection points K2 and K3 is extremely high. Multiple distributors can be formed from the double distributors/combiners. Conventional windings or else striplines may be used, depending on the frequency range required.

The combiner VK1 and the distributor VK2, which have the same circuit apart from the amplifiers, are constructed from these distributors/combiners.

Figure 4:
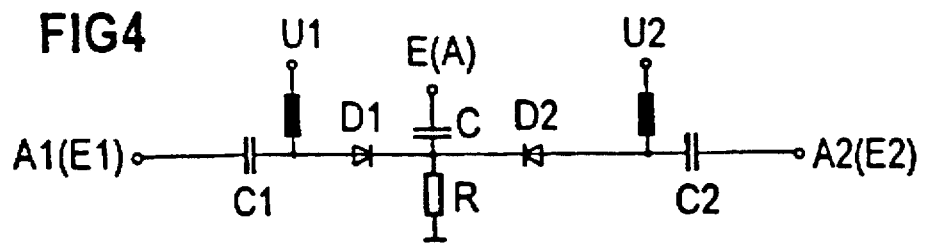
FIG. 4 shows an advantageous drive for a pin-diode changeover switch.

FIG. 4 shows a particularly advantageous drive for the pin-diode switches. Two diodes D1 and D2 are interconnected by the same connections, which form the input of an input changeover switch or the output of an output changeover switch. Inputs E, (E1, E2) or outputs A1, A), (A) are DC-decoupled by capacitors C, C1, C2. The diode D1 is forward-biased via the resistor R by means of an operating voltage U1 (approximately +3 to +5 V) which is applied via an inductor DR1, while the other diode D2 is reverse-biased by a control voltage U2=0 V. If the control voltage U2 is raised to +10 V, then the diode D2 is forward-biased, but the diode D1 is reverse-biased, since approximately +9 V are now present on its cathode. A parallel-path diode, which is connected to the input E1 (output A1) can at the same time be connected through earth by the control voltage U2. Only one control voltage 0/U2 and only one control line are required for this advantageous arrangement.

Figure 5:
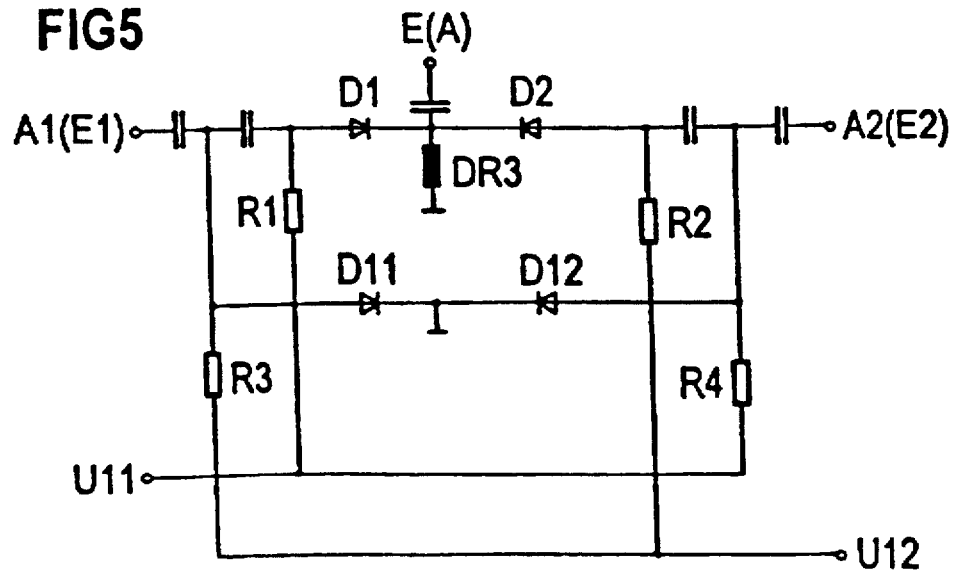
FIG. 5 shows a further drive option for a pin-diode changeover switch.

FIG. 5 shows a pin-diode arrangement which has parallel-path diodes D11 and D12. The diodes D1 and D12 are forward-biased by a positive control voltage U11, while the diodes D2 and D11 are reverse-biased by a control voltage U2.

The control voltage is applied to the series-path diodes D1 and D2 via resistors R1 and R2. The common junction point is connected to ground via an inductor R3. This circuit requires only one inductor D3. Inductors can, of course, also be used instead of the resistors R1 and R2 as well as R3 and R4.

FIG. 6 shows the outline circuit diagram of a variant of the passive combiner. This is constructed using electronic switches SK1, SK2, ..., to whose inputs E1, E2, ... the input signals ES1, ES2, ... are supplied, one of which is in each case connected through via a single closed electronic switch as a substitute input signal EES, via an associated decoupling resistor RE, to a common junction point and generally via an amplifier V1—to the substitute functional unit.

FIG. 7 illustrates the outline circuit diagram of a corresponding distributor, in which the substitute output signal EAS—generally via an amplifier V2—is connected through from a splitting point, via in each case one decoupling resistor RE and, once again, an electronic switch SV1, SV2, . . . , to one of the outputs A1, A2, . . . In contrast to a distributor which is constructed using, for example, double distributors/combiners, the substitute output signal is in this case connected through to only one output.

Figure 8:
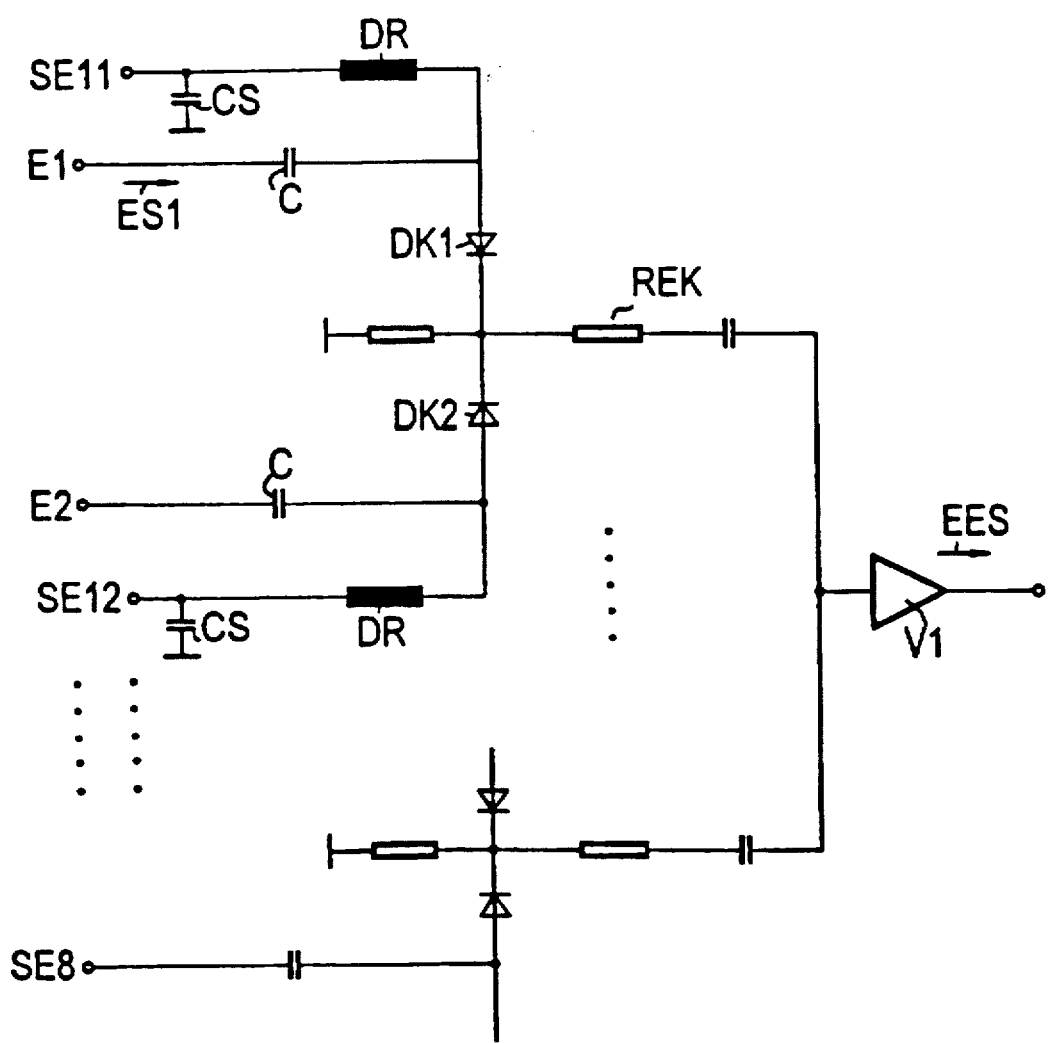
FIG. 8 shows an exemplary embodiment of a combiner.

FIG. 8 illustrates an advantageous embodiment of the passive combiner, in which in each case two pin-diodes DK1, DK2 are interconnected by their same electrodes. Their other connection is in each case routed via a coupling capacitor C to an input E1, E2, . . . One of the diodes can be forward-biased via control inputs SE11, SE12, . . . via an inductor DR and a filter capacitor CS. The input signal ES1 which is connected through is then routed from the junction point of the pin-diodes via a common decoupling resistor REK to the input of the amplifier V1, to which yet further identically constructed switch pairs are as a rule connected.

Figure 9:
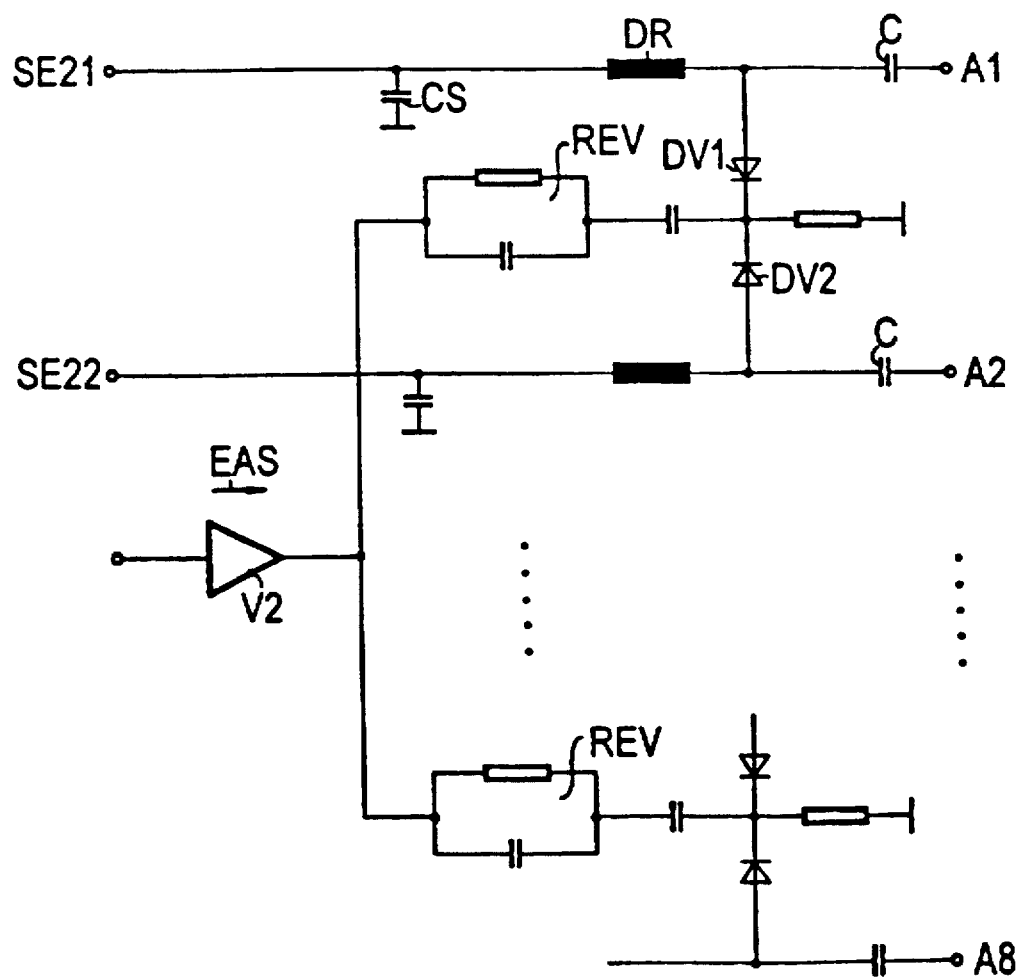
FIG. 9 shows an exemplary embodiment of a distributor.

A corresponding distributor is constructed in FIG. 9. The output of the second amplifier V2 is routed via in each case one further decoupling resistor REV to a pin-diode pair, whose identical electrode connections are interconnected, while the other diode connections are in each case routed via coupling capacitors to an output A1, A2, . . . , via which the substitute output signal EAS is connected through. In each case one pin-diode is connected through via a filter circuit, comprising an inductor and a filter capacitor, by control voltages which are applied to control inputs SE21, SE22, . . . .

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A substitute circuit for a plurality of functional units processing analog or digital signals, comprising:

at least one combination unit and one substitute functional unit, which is connected thereto, the at least one combination unit and one substitute functional unit being assigned to a plurality of identical functional units;

at least one electronic input changeover switch, which has a plurality of outputs, assigned to each of said identical functional units, via which electronic input changeover switch one input signal for each of the identical functional units is supplied to a respective identical functional unit of the identical functional unit or to the combination unit;

at least one electronic output changeover switch, which has a plurality of inputs, assigned to each of said identical functional units, via which electronic output changeover switch one output signal from the respective identical functional unit is emitted or a substitute output signal from the substitute functional unit is emitted, via the combination unit;

the combination unit having a passive combiner for combining two input signals, the combination unit having inputs to which second outputs of the input changeover switches are routed, and the combination unit having output routed to a signal input of the substitute functional unit;

the combination unit having a passive distributor for splitting a substitute output signal which comes from the substitute functional unit, the passive distributor, having outputs connected to a respective second input of a respective output changeover switch; and all identical functional units connected to a control logic device which disconnects a defective identical functional unit based on fault messages via the input changeover switches and the output changeover switches and which inserts the substitute functional unit in place of said defective identical functional unit.

2. The substitute circuit as claimed in claim 1, wherein the substitute circuit has at least two combination units and two substitute functional units, and wherein the input changeover switches have at least three outputs and the output changeover switches have at least three inputs, and wherein the outputs and inputs of the changeover switches are connected to the combination units.

3. The substitute circuit as claimed in claim 1, wherein the functional units have fault monitoring.

4. The substitute circuit as claimed in claim 1, wherein a control logic device is provided on the combination unit, evaluates the fault messages and controls the input and output changeover switches.

5. The substitute circuit as claimed in claim 1, wherein the combination unit has broadband amplifiers which compensate for attenuation of the combiners and distributors.

6. The substitute circuit as claimed in claim 1, wherein the identical functional units and changeover switches input and output are arranged on an assembly.

7. The substitute circuit as claimed in claim 1, wherein each of the input changeover switches and output changeover switches is a pin-diode changeover switch.

8. The substitute circuit as claimed in claim 7, wherein each of the pin-diode changeover switches has first and second pin-diodes, and wherein a constant first control voltage is applied to the first pin-diode, and wherein only a second control voltage which is applied to the second pin-diode is varied for switching over.

9. The substitute circuit as claimed in claim 7, wherein each of the pin-diode changeover switches has additional parallel-path diodes, further control voltages therefore being supplied via resistors, and the junction point of a series-path of the first and second diodes being connected to ground via an inductor.

10. The substitute circuit as claimed in claim 1, wherein the passive distributor and/or the passive combiner is constructed from double distributors/combiners or multiple distributors/combiners, respectively, which are constructed using transformers.

11. The substitute circuit as claimed in claim 1, wherein the passive combiner is constructed with pin-diode switches which are routed from a plurality of inputs via decoupling resistors to a junction point and/or the passive distributor is constructed with pin-diode switches which are routed from a common splitting point to a plurality of outputs.

12. The substitute circuit as claimed in claim 11, wherein for a combiner two pin-diode switches are interconnected by common connections, which are routed via a common decoupling element to the junction point, and wherein for a distributor, and wherein each of two pin-diode switches, which are interconnected by common connections, are connected via a common decoupling resistor to the splitting point.

* * * * *